United States Patent
Ehlert et al.

(10) Patent No.: US 10,747,095 B2
(45) Date of Patent: Aug. 18, 2020

(54) METHOD FOR CALIBRATING A PROJECTION DEVICE AND METHOD FOR OPERATING A PROJECTION DEVICE CALIBRATED IN THIS MANNER

(71) Applicant: Robert Bosch GmbH, Stuttgart (DE)

(72) Inventors: Alexander Ehlert, Reutlingen (DE); Julian Heinzelmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/067,177

(22) PCT Filed: Jan. 9, 2017

(86) PCT No.: PCT/EP2017/050322
§ 371 (c)(1),
(2) Date: Jun. 29, 2018

(87) PCT Pub. No.: WO2017/121698
PCT Pub. Date: Jul. 20, 2017

(65) Prior Publication Data
US 2019/0028684 A1 Jan. 24, 2019

(30) Foreign Application Priority Data

Jan. 11, 2016 (EP) .................................... 16150760
Jan. 5, 2017 (DE) ......................... 10 2017 200 101

(51) Int. Cl.
*H04N 9/31* (2006.01)
*G03B 21/20* (2006.01)
(Continued)

(52) U.S. Cl.
CPC ..... *G03B 21/2066* (2013.01); *G02B 26/0833* (2013.01); *G02B 27/102* (2013.01);
(Continued)

(58) Field of Classification Search
CPC .. G02B 26/0833; G02B 26/10; G02B 27/102; G03B 21/2066
(Continued)

(56) References Cited

U.S. PATENT DOCUMENTS

| 8,223,161 B2 * | 7/2012 | Brown ..................... G09G 3/02 345/536 |
| 8,884,975 B2 | 11/2014 | Satoh et al. |
| 2015/0208048 A1 | 7/2015 | Pei et al. |

FOREIGN PATENT DOCUMENTS

WO 2009025976 A1 2/2009

OTHER PUBLICATIONS

International Search Report for PCT/EP2017/050322, dated Apr. 7, 2017.
(Continued)

*Primary Examiner* — Jefferey F Harold
*Assistant Examiner* — Jean W Desir
(74) *Attorney, Agent, or Firm* — Norton Rose Fulbright US LLP; Gerard Messina

(57) ABSTRACT

A method for calibrating a projection device, the projection device being equipped with at least two controllable and regulatable light sources, which each transmit a beam component of a scanning beam. The calibration method includes defining a reference beam for the scanning beam; determining, in each instance, a dewarping function for the x-projector coordinate and for the y-projector coordinate of the reference beam, each dewarping function converting the specific projector coordinate to corresponding image coordinates, which are assigned to the image information; determining, in each instance, an offset function for the x-projector coordinate and the y-projector coordinate for all beam components, each offset function approximating the offset between the specific x- or y-image coordinate of the refer-
(Continued)

ence beam and the x- or y-image coordinate of the respective beam component.

7 Claims, 3 Drawing Sheets

(51) Int. Cl.
*G02B 27/10* (2006.01)
*G02B 26/08* (2006.01)
*G02B 27/30* (2006.01)
*H01S 5/40* (2006.01)
*G02B 27/14* (2006.01)
*H01S 5/00* (2006.01)
*H01S 5/022* (2006.01)

(52) U.S. Cl.
CPC ......... *G02B 27/104* (2013.01); *G02B 27/141* (2013.01); *G02B 27/30* (2013.01); *G03B 21/2033* (2013.01); *H01S 5/4012* (2013.01); *H01S 5/4025* (2013.01); *H04N 9/3129* (2013.01); *H04N 9/3155* (2013.01); *H04N 9/3164* (2013.01); *H04N 9/3185* (2013.01); *H01S 5/005* (2013.01); *H01S 5/0071* (2013.01); *H01S 5/02252* (2013.01); *H01S 5/4093* (2013.01)

(58) Field of Classification Search
USPC ....... 348/746, 754, 747, 744, 806, 807, 745; 345/600, 606, 647, 672
See application file for complete search history.

(56) References Cited

OTHER PUBLICATIONS

Glasbey C A et al., "A review of image-warping methods", Journal of Applied Statistics, Carfax Publishing Co., Abingdon, GB, vol. 25, No. 2, Apr. 1, 1998 (Apr. 1, 1998), pp. 155-171, XP002570074.

\* cited by examiner

METHOD FOR CALIBRATING A PROJECTION DEVICE AND METHOD FOR OPERATING A PROJECTION DEVICE CALIBRATED IN THIS MANNER

BACKGROUND INFORMATION

The present invention relates to so-called scanning projection devices for displaying image information discretely stored, the scanning beam of the projection devices being made up of a plurality of beam components of different light sources, such as a flying spot laser raster scanner. The present invention is used for compensating for the offset between the individual beam components of the scanning beam of such a projection device.

In this case, the image formation is accomplished with the aid of a pulsed light beam, which scans the projection surface, using a particular trajectory, e.g., line by line. In this context, the intensity of this scanning beam is varied according to the image information to be displayed. As already mentioned, in the case of the projection devices in question here, the scanning beam is made up of a plurality of components of different light sources, which cover different wavelength ranges. The beam components ideally overlap in the projection plane and form a single pixel. Thus, by variation of the intensity of the individual light sources, a very large color spectrum may be represented in this manner. However, in practice, an optimal alignment of the light sources with respect to the optical construction of the projection device is rarely attained, which means that generally, an offset between the pixels of the individual beam components is present.

The image information is provided in the form of discrete scanning values. Each scanning value is assigned to an image point. These "ideal" image points are situated in a raster, which covers the entire image surface and is described by integral image coordinates of a rectilinear and, generally, orthogonal image coordinate system. Due to the optical construction, which is necessary for the alignment and deflection of the individual beam components during the scanning/projection operation, the actual trajectory of the scanning beam, that is, of the individual beam components of the scanning beam, deviates from this raster, which means that the position of the projected pixels does not correspond to the raster points. The projected pixels span the so-called projector coordinate system, which, in contrast to the image coordinate system, is not rectilinear and orthogonal, but, as a rule, curved. In this projector coordinate system, the projected pixels are assigned integral projector coordinates.

In a non-corrected pixel video stream, the image information of a particular image point would be assigned to the pixel, whose projector coordinates are identical to the image coordinates of this image point. In this instance, nearly all of the pixels would be projected differently from the corresponding image coordinates. As a result, this procedure produces image distortion.

In order to prevent this, the non-linear difference of the projector coordinates from the image coordinates is compensated for by preprocessing the image information during the projection operation. This preprocessing of the image information requires calibration of the projection device. In this context, a function is determined, which converts the projector coordinates of the pixels to image coordinates, which is referred to as dewarping.

During the projection operation, the projector coordinates of the individual, projected pixels are converted into image coordinates with the aid of this predefined dewarping function, in order to then assign the specific pixel the image information, which corresponds to its position in the image surface. Generally, the image coordinates of the real pixels are not integral. Thus, the regulation of the intensity of the corresponding light source is mostly based on not only a single scanning value of the image information, but on a mean of scanning values, in a surrounding area to be defined, of the image coordinates of the real pixel. This preprocessing of the image information allows the nonlinear difference between image coordinates and projector coordinates to be compensated for, and corresponding image distortion to be prevented.

The complexity and, consequently, the computing expenditure for the dewarping is, first of all, a function of the type of optical layout, which is selected and implemented for the alignment and deflection of the individual beam components during the scanning/projection operation, and secondly, a function of the targeted quality of the image reproduction. If the dewarping is applied to all light sources involved in the projection operation, then not only is the image distortion compensated for, but also the offset between the color components of the individual pixels, which is superimposed on this image distortion. Depending on the number of light sources involved, this is associated with a very high computing expenditure.

PCT Application No. WO 2009/025976 describes an option of compensating for the offset between the individual beam components in the projection plane largely independently of the image distortion. To that end, in an initial calibration step, an offset corresponding to the offset is initially determined for each beam/color component. According to PCT Application No. WO 2009/025976, during the projection operation, the image information is written to a temporary storage unit, in which the image information of an entire image is stored, namely, so as to be divided up according to color channels and provided with position information. In this context, the image information of each color channel, that is, the associated position information, is acted upon by the respective offset determined in advance. The image information acquired in this manner is then used as input data for a dewarping method and a compensation of image distortion based on it. In the case of PCT Application No. WO 2009/025976, the dewarping is therefore only carried out for a single light source involved with the projection operation, which limits the computing expenditure markedly.

However, the variant, described in PCT Application No. WO 2009/025976, of compensating for the offset between the individual beam components of the sampling beam of a projection device requires a relatively large temporary storage unit for the image information. For some applications, such as mobile projection devices from the area of consumer electronics, this proves to be problematic.

SUMMARY

The present invention provides the option of compensating for the offset between the individual beam components of the scanning beam of a projection device, without increased storage requirements for the image information and with a comparatively low level of computing expenditure.

According to the present invention, it has been recognized that not only the image distortion may be determined for all of the beam components individually, but also the offset of each individual beam component with respect to a reference beam defined in advance may be determined. In this context, both the offset and the distortion are a function of position. Thus, generally, the distortion and the offset are greater at the edges of the image than in the center of the image. The present invention is based on the assumption that the offset between the pixels of the individual beam components may be described, using less computing expenditure than the conversion of the projector coordinates to image coordinates of the pixels.

Thus, according to the present invention, it is provided that a calibration of the projection device be implemented, which includes, for example, the following method steps:
a. defining a reference beam for the scanning beam;
b. determining, in each instance, a dewarping function for the x-projector coordinate and for the y-projector coordinate of the reference beam, each dewarping function converting the specific projector coordinate to corresponding image coordinates, which are assigned to the image information;
c. determining, in each instance, an offset function for the x-projector coordinate and the y-projector coordinate for all beam components, each offset function approximating the offset between the specific x- or y-image coordinate of the reference beam and the respective x- or y-image coordinate of the respective beam component;
d. providing the dewarping functions for the reference beam; and
e. providing the offset functions for all of the beam components.

During operation of the projection device, the dewarping functions for the reference beam acquired in this manner, and the offset functions for the individual beam components, are then used for determining the image coordinates of the pixels of the individual light sources. To that end, the method of the present invention for operating a projection device provides:
a. that each pixel generated by a light source be assigned an x- and a y-projector coordinate in accordance with its position on the trajectory, simultaneously generated pixels of different light sources being assigned the same x- and y-projector coordinates;
b. that each of these x- and y-projector coordinates be converted to corresponding image coordinates of the image information with the aid of an x-dewarping function and y-dewarping function, respectively,
in a calibration method, the dewarping functions being determined in advance for a reference beam, and
the image coordinates determined in this manner acting as a reference pixel position for all of the light sources;
c. that the offset of the position of the pixels generated by the individual light sources with respect to the corresponding reference pixel position be determined with the aid of an x- or y-offset function, which is determined in advance for each light source, in a calibration method; and
d. that this offset determined individually for each light source be added to the image coordinates of the reference pixel position, in order to determine the image coordinates of the pixels of the single light sources individually.

The image coordinates acquired in this manner are then taken as a basis for a preprocessing of the image information, which allows compensation for the image distortion and the offset by appropriate control of the individual light sources.

Thus, a comparatively simple option, by which the projector coordinates of the pixels generated by the individual light sources may be converted to image coordinates during the projection operation, is provided by the calibration method of the present invention in conjunction with the method of the present invention for operating a projection device. The actual compensation for both the image distortion and the offset between the pixels of the different light sources then takes place initially within the scope of processing of the stored image information. This processing is based on the image coordinates of the pixels ascertained in accordance with the present invention.

According to the present invention, a reference beam for the scanning beam is defined within the scope of the calibration method. In this context, an arbitrary beam component of the scanning beam is simply selected as a reference beam in an advantageous manner. In this case, the offset of each of the remaining beam components with respect to this reference beam is then to be determined. However, there is also the option of defining a reference beam as an average over the beam components. In this case, the offset with respect to the reference beam must be determined for all of the beam components.

Within the scope of the calibration method, the present invention provides that an x- and a y-dewarping function, which converts the projector coordinates of the specific pixels as precisely as possible into image coordinates, be ascertained once for at least the reference beam. In one possible variant of the calibration method, an x- and y-dewarping function are additionally ascertained once for all remaining beam components, as well. In order then to determine the x- and y-offset functions, in each instance, using the difference between the dewarping functions of the specific beam component and the dewarping functions of the reference beam.

In each case, it proves to be advantageous when the dewarping functions for the reference beam and, optionally, for the remaining beam components, as well, are approximated by nth-degree polynomials. The offset functions are also advantageously approximated by mth-degree polynomials. Since it may be assumed that the offset between the pixels of the individual beam components is limited, the offset functions may be approximated mostly by polynomials of lower order than the dewarping polynomials, that is, m<n.

This considerably reduces the computing expenditure for determining the image coordinates of the individual pixels during the projection operation, for the computational expenditure for calculating polynomials decreases markedly with the degree of the polynomial. According to the present invention, the dewarping polynomials of higher order must be calculated only once, namely, for the reference beam, in order to determine the corresponding image coordinates. Only the offset polynomials of lower order are calculated for the image coordinates of the pixels of the remaining beam components, in order to then add this result to the result already available for the reference beam.

BRIEF DESCRIPTION OF THE DRAWINGS

Advantageous specific embodiments and further refinements of the present invention are explained in greater detail below, with reference to the figures.

DETAILED DESCRIPTION OF EXAMPLE EMBODIMENTS

Figure 1:
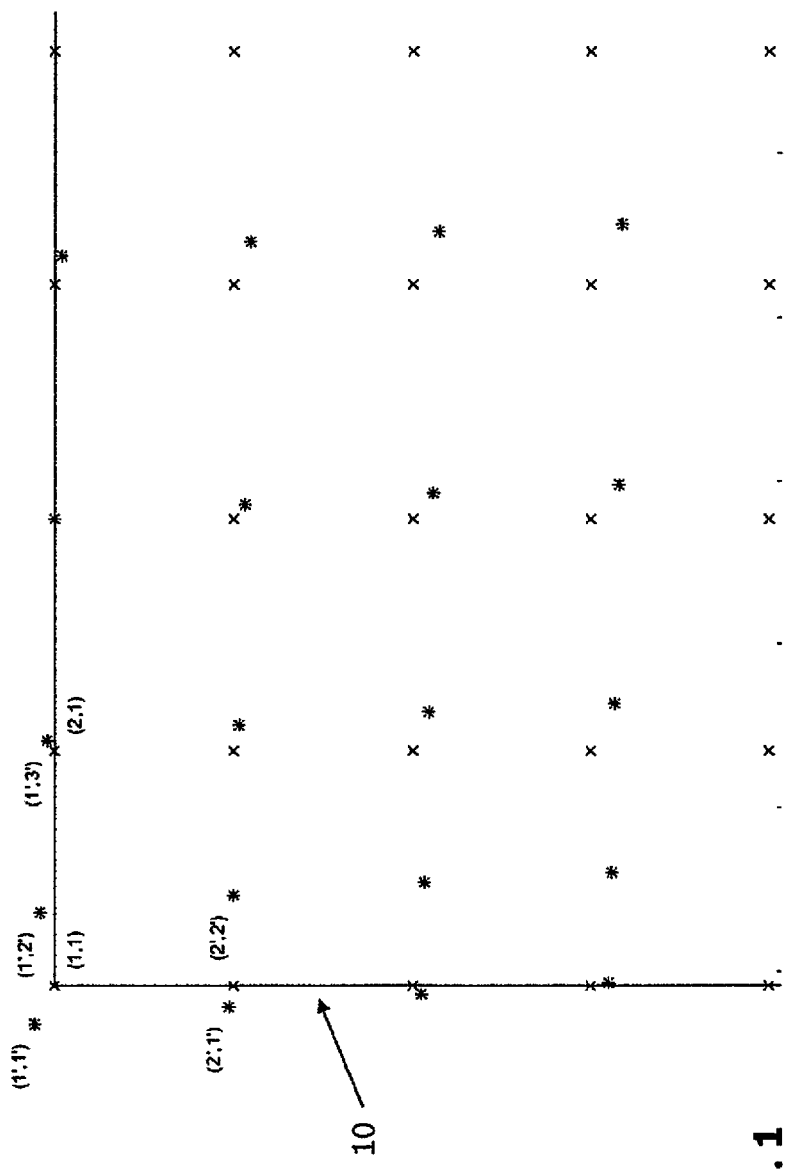
FIG. 1 shows a detail of image or projection surface 10 including superpositioning of the projector coordinate system and the image coordinate system of a projection device, which may be calibrated and operated according to the present invention.

FIG. 1 shows image or projection surface 10 of a projection device of the type in question here, such as a so-called flying spot laser raster scanner. FIG. 1 illustrates the difference in the position of the scanning beam pixels actually generated, represented here as stars, from the positions in image surface 10, which are assigned the discretely stored image information. Here, these positions are represented as crosses. The crosses are positioned in a raster, equidistantly within a row or a column. This raster forms a rectilinear and orthogonal image coordinate system and covers entire image surface 10. The individual raster points, that is, the positions, which are assigned to the discretely stored image information, are described by integral image coordinates.

The optical path, that is, the trajectory of the scanning beam, deviates from this raster, which means that the position of the projected pixels does not correspond to the raster points. The projected pixels span the projector coordinate system, which, in contrast to the image coordinate system, is not rectilinear and orthogonal, but is normally curved, in fact, as a function of the optical construction of the projection device. In this projector coordinate system, the projected pixels have integral projector coordinates. In the present case, the projector coordinates cover a greater area than the image surface. Thus, the projector coordinate system is distorted in comparison with the image coordinate system. FIG. 1 illustrates that this distortion is more pronounced at the edges of the image than in the center of the image.

In a non-corrected pixel video stream, the image information of a particular image point would be assigned to the pixel, whose projector coordinates are identical to the image coordinates of this image point. Specifically, this means, for example, that the pixel (1', 1') would be assigned the image information of image point (1, 1), although this pixel is outside of the image surface. As with pixel (1', 1'), nearly all of the other pixels would also be projected differently from the corresponding image coordinates. As a result, this procedure produces image distortion. In this context, it may be contortion, pillow-type distortion, trapezoidal distortion or other difference of higher order.

In order to prevent corresponding image distortion, the non-linear difference of the projector coordinates from the image coordinates is compensated for by preprocessing the image information during the projection operation. For this, however, the projector coordinates of the pixels must first be converted to image coordinates, which is referred to as dewarping. As a rule, the pixel image coordinates acquired in this manner are not integral. In order to assign each pixel, as much as possible, the image information, which corresponds to its position in the image surface, each pixel is normally assigned not only a single scanning value of the image information, but an average of sampling values in a surrounding area to be defined, of the ascertained image coordinates of the pixel. This preprocessing of the image information allows the nonlinear difference between image coordinates and projector coordinates to be compensated for, and corresponding image distortion to be prevented.

Figure 2:
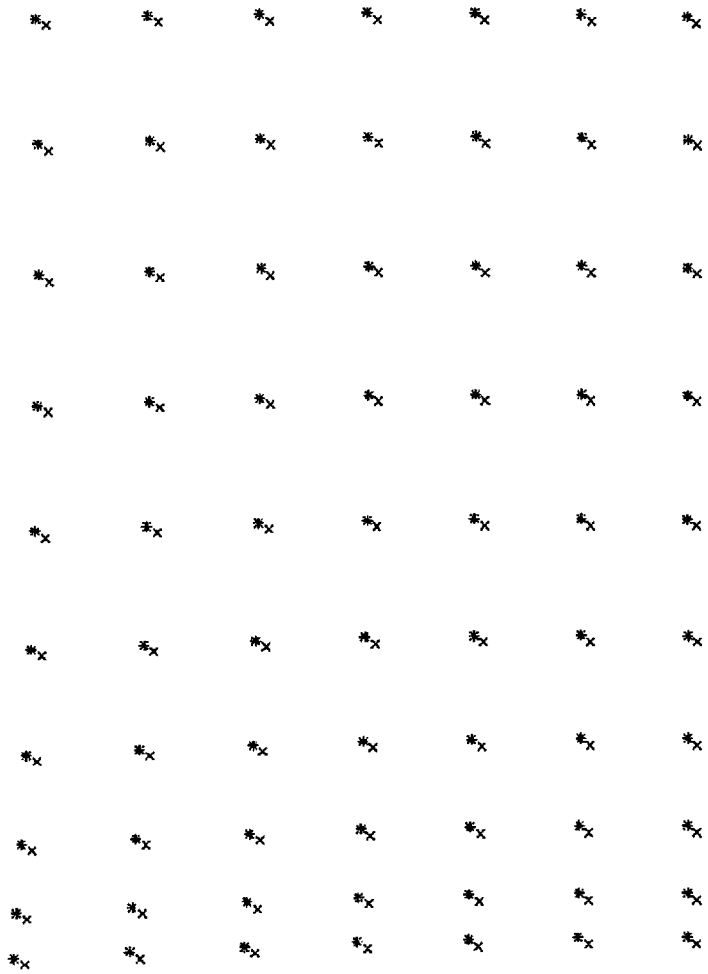
FIG. 2 shows the positions of the pixels of two light sources on the projection surface, and the offset between these pixel positions.

A further effect is superimposed on the effect described above in connection with FIG. 1, if the projection device includes a plurality of light sources. In this case, the scanning beam is made up of a plurality of beam components, which allow a color display. In this context, it may include laser diodes of the colors red, green and blue. However, two red laser diodes, a green, and a blue laser diode may also be provided. In practice, due to the optical construction, the individual beam components trace substantially the same trajectory. The pixels of the individual light sources or beam components ideally overlap. In practice, however, an offset often occurs between the pixels of the individual light sources, which is attributed to inevitable alignment errors of the optical layout. FIG. 2 illustrates this offset between the two beam components of the scanning beam of a projection device of the type in question, here. The projection plane and/or image surface is depicted, including the raster of the pixel positions of the two beam components, which are represented here, in each instance, by crosses and stars. FIG. 2 shows clearly that this offset is indeed a function of the position of the pixels on the image surface, as well, but is substantially linear.

Therefore, according to the present invention, the image coordinates of the pixels are not ascertained with the aid of a dewarping function for all of the beam components during the projection operation, but only for a reference beam to be defined in advance. Then, for the pixels of the remaining beam components, only the offset with respect to the corresponding pixels of the reference beam is ascertained and added to the image coordinates of this reference pixel, which is illustrated by the block diagram of FIG. 3.

Figure 3:
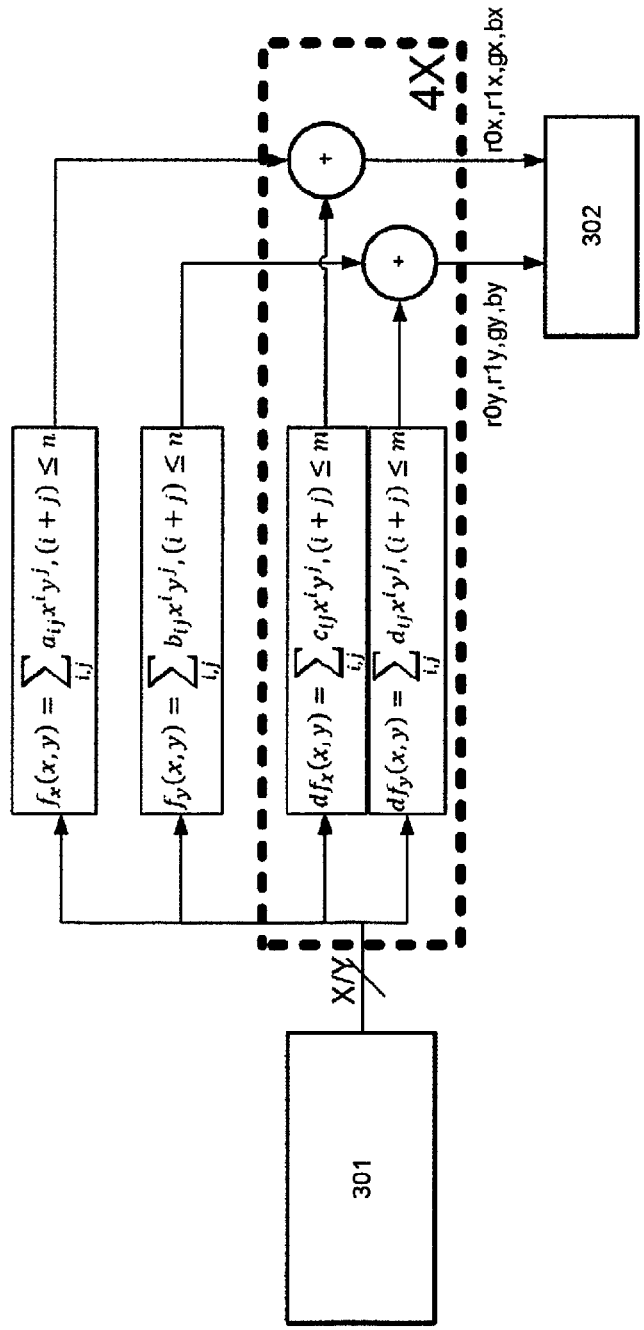
FIG. 3 shows a block diagram for illustrating the method of the present invention for operating a projection device.

FIG. 3 relates to a projection device having a total of four light sources, namely, two red laser diodes r0 and r1, one green laser diode g and one blue laser diode b. These are assigned a rasterizer 301, which assigns projector coordinates x, y to the pixels of the individual light sources and/or beam components; simultaneously generated pixels of different light sources r0, r1, g and b being assigned identical projector coordinates x, y. These projector coordinates x, y are converted to image coordinates with the aid of an x-dewarping function and a y-dewarping function. In the exemplary embodiment described here, these two dewarping functions are each 5th-order polynomials of the type $f(x,y) \Sigma_{i,j} a_{ij} x^i y^j$, $(i+j) \leq 5$, which are ascertained in advance within the scope of a calibration method for a reference light source and/or a reference beam. Projector coordinates x, y are also used for ascertaining the offset of the pixels of all remaining light sources or beam components with respect to the reference beam. This is accomplished with the aid of an x-offset function and a y-offset function, which are ascertained individually for each light source in advance, within the scope of the calibration method. In the exemplary embodiment described here, these offset functions are each a 3rd-order polynomial of the type $df(x,y)=\Sigma_{i,j} a_{ij} x^i y^j$, $(i+j) \leq 3$. The image coordinates r0y, r1y, gy, by and r0x, r1x, gx, bx for the pixels of the individual beam components are finally determined, in that the individual offset with respect to the reference beam is initially ascertained for each beam component. This is then added to the image coordinates of the reference beam, which are ascertained with the aid of the dewarping functions for the reference beam.

As described above, the image coordinates acquired in this manner are then taken as a basis for a preprocessing of the image information. In this context, intensity values, which correspond to the specific position of the pixels in the image surface, are determined for the individual beam components. The image information is stored in a storage component 302.

As already mentioned, a reference beam for the scanning beam is defined within the scope of the calibration method according to the present invention. In this context, it may simply be an arbitrary beam component of the scanning beam. However, the reference beam may also be defined as an average over the beam components. The block diagram represented in FIG. 3 includes both variants, since here, the offset with respect to the reference beam is determined for all of the beam components. If a beam component acts as a reference beam, then the offset for this beam component is simply set to zero.

Within the scope of the calibration method, the difference of the projector coordinates of the specific pixels from the image coordinates is ascertained for at least a reference beam. For example, a camera system may be used for that. On the basis of the information acquired in this manner, a function, which approximates this difference as effectively as possible, is defined as a dewarping function. Polynomials of higher order, as in the exemplary embodiment described here, present themselves for that. The offset functions for the individual beam components are likewise approximated by polynomials in an advantageous manner. Since it may be assumed that the offset between the pixels of the individual beam components is limited, the offset functions may be advantageously approximated by polynomials of lower order than the dewarping polynomials.

What is claimed is:

1. A method for calibrating a projection device for displaying discretely stored image information with the aid of at least two controllable and regulatable light sources, which each transmit a beam component of a scanning beam, and using devices for focusing, aligning and moving the beam components, so that pixels corresponding to the light sources overlap as much as possible on a projection surface and may be moved in a predefined trajectory over the projection surface, the method comprising:
 a. defining a reference beam for the scanning beam;
 b. determining, in each instance, a dewarping function for an x-projector coordinate and for a y-projector coordinate of the reference beam, each dewarping function converting the respective projector coordinate to corresponding image coordinates, which are assigned to the image information;
 c. determining, in each instance, an offset function for the x-projector coordinate and the y-projector coordinate for all beam components, each offset function approximating an offset between the respective x- or y-image coordinate of the reference beam and a corresponding x- or y-image coordinate of the respective beam component;
 d. providing the dewarping functions for the reference beam; and
 e. providing the offset functions for all of the beam components,
 wherein the a reference beam is determined by taking an average over optical paths of the beam components.

2. A method for calibrating a projection device for displaying discretely stored image information with the aid of at least two controllable and regulatable light sources, which each transmit a beam component of a scanning beam, and using devices for focusing, aligning and moving the beam components, so that pixels corresponding to the light sources overlap as much as possible on a projection surface and may be moved in a predefined trajectory over the projection surface, the method comprising:
 a. defining a reference beam for the scanning beam;
 b. determining, in each instance, a dewarping function for an x-projector coordinate and for a y-projector coordinate of the reference beam, each dewarping function converting the respective projector coordinate to corresponding image coordinates, which are assigned to the image information;
 c. determining, in each instance, an offset function for the x-projector coordinate and the y-projector coordinate for all beam components, each offset function approximating an offset between the respective x- or y-image coordinate of the reference beam and a corresponding x- or y-image coordinate of the respective beam component;
 d. providing the dewarping functions for the reference beam; and
 e. providing the offset functions for all of the beam components,
 wherein the dewarping functions are determined as nth-degree polynomials of the form $$f(x, y) = \sum_{i,j} a_{ij} x^i y^i, \ (i + j) \le n.$$

3. The calibration method as recited in claim 2, wherein m<n.

4. A method for calibrating a projection device for displaying discretely stored image information with the aid of at least two controllable and regulatable light sources, which each transmit a beam component of a scanning beam, and using devices for focusing, aligning and moving the beam components, so that pixels corresponding to the light sources overlap as much as possible on a projection surface and may be moved in a predefined trajectory over the projection surface, the method comprising:
 a. defining a reference beam for the scanning beam;
 b. determining, in each instance, a dewarping function for an x-projector coordinate and for a y-projector coordinate of the reference beam, each dewarping function converting the respective projector coordinate to corresponding image coordinates, which are assigned to the image information;
 c. determining, in each instance, an offset function for the x-projector coordinate and the y-projector coordinate for all beam components, each offset function approximating an offset between the respective x- or y-image coordinate of the reference beam and a corresponding x- or y-image coordinate of the respective beam component;
 d. providing the dewarping functions for the reference beam; and
 e. providing the offset functions for all of the beam components, wherein the offset functions are determined as mth-degree polynomials of the form $$df(x, y) = \sum_{ij} a_{ij} x^i y^j, \ (i + j) \le m.$$

5. A method for operating a projection device for displaying discretely stored image information with the aid of at least two controllable and regulatable light sources, which each transmit a beam component of a scanning beam, and using components for focusing, aligning and moving the beam components, so that the corresponding pixels overlap as much as possible on a projection surface and may be moved in a predefined trajectory over the projection surface, the method comprising:

a. assigning each pixel generated by a light source an x- and a y-projector coordinate in accordance with its position on the trajectory, simultaneously generated pixels of different light sources being assigned the same x- and y-projector coordinates;
b. converting each of the x and y projector coordinates to corresponding image coordinates of the image information with the aid of an x-dewarping function and y-dewarping function, respectively, the dewarping functions being determined in advance for a reference beam in a calibration method, and the image coordinates acting as a reference pixel position for all of the light sources;
c. determining an offset of the position of the pixels generated by the individual light sources with respect to corresponding reference pixel positions with the aid of an x- or y-offset function, which is determined in advance for each light source in a calibration method; and
d. adding the offset determined for individual light sources is added to the image coordinates of the reference pixel position, to determine the image coordinates of the pixels of each one of the individual light sources, wherein the a reference beam is determined by taking an average over optical paths of the beam components.

6. A method for operating a projection device for displaying discretely stored image information with the aid of at least two controllable and regulatable light sources, which each transmit a beam component of a scanning beam, and using components for focusing, aligning and moving the beam components, so that the corresponding pixels overlap as much as possible on a projection surface and may be moved in a predefined trajectory over the projection surface, the method comprising:
a. assigning each pixel generated by a light source an x- and a y-projector coordinate in accordance with its position on the trajectory, simultaneously generated pixels of different light sources being assigned the same x- and y-projector coordinates;
b. converting each of the x and y projector coordinates to corresponding image coordinates of the image information with the aid of an x-dewarping function and y-dewarping function, respectively, the dewarping functions being determined in advance for a reference beam in a calibration method, and the image coordinates acting as a reference pixel position for all of the light sources;
c. determining an offset of the position of the pixels generated by the individual light sources with respect to corresponding reference pixel positions with the aid of an x- or y-offset function, which is determined in advance for each light source in a calibration method; and
d. adding the offset determined for individual light sources is added to the image coordinates of the reference pixel position, to determine the image coordinates of the pixels of each one of the individual light sources, wherein the dewarping functions are determined as nth-degree polynomials of the form $$f(x, y) = \sum_{i,j} a_{ij} x^i y^j, \; (i+j) \leq n.$$

7. A method for operating a projection device for displaying discretely stored image information with the aid of at least two controllable and regulatable light sources, which each transmit a beam component of a scanning beam, and using components for focusing, aligning and moving the beam components, so that the corresponding pixels overlap as much as possible on a projection surface and may be moved in a predefined trajectory over the projection surface, the method comprising:
a. assigning each pixel generated by a light source an x- and a y-projector coordinate in accordance with its position on the trajectory, simultaneously generated pixels of different light sources being assigned the same x- and y-projector coordinates;
b. converting each of the x and y projector coordinates to corresponding image coordinates of the image information with the aid of an x-dewarping function and y-dewarping function, respectively, the dewarping functions being determined in advance for a reference beam in a calibration method, and the image coordinates acting as a reference pixel position for all of the light sources;
c. determining an offset of the position of the pixels generated by the individual light sources with respect to corresponding reference pixel positions with the aid of an x- or y-offset function, which is determined in advance for each light source in a calibration method; and
d. adding the offset determined for individual light sources is added to the image coordinates of the reference pixel position, to determine the image coordinates of the pixels of each one of the individual light sources, wherein the offset functions are determined as mth-degree polynomials of the form $$df(x, y) = \sum_{ij} a_{ij} x^i y^j, \; (i+j) \leq m.$$

* * * * *